United States Patent
Xia et al.

(10) Patent No.: US 8,437,169 B2
(45) Date of Patent: May 7, 2013

(54) FAST RESPONSE CIRCUITS AND METHODS FOR FRAM POWER LOSS PROTECTION

(75) Inventors: Degang Xia, Allen, TX (US); Steven Chacko, League City, TX (US); Richard Lawrence Duncan, Bedford, TX (US); Chuan Ni, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 12/973,362

(22) Filed: Dec. 20, 2010

(65) Prior Publication Data

US 2012/0155144 A1    Jun. 21, 2012

(51) Int. Cl.
*G11C 11/22* (2006.01)
(52) U.S. Cl.
USPC ............................. 365/145; 365/229; 365/228
(58) Field of Classification Search .................. 365/145, 365/228, 229
See application file for complete search history.

(56) References Cited

U.S. PATENT DOCUMENTS

| | | | | |
|---|---|---|---|---|
| 3,562,555 A | * | 2/1971 | Ahrons | 365/229 |
| 5,574,679 A | * | 11/1996 | Ohtsuki et al. | 365/145 |
| 5,943,257 A | * | 8/1999 | Jeon et al. | 365/145 |
| 6,157,979 A | * | 12/2000 | Barnett | 710/267 |
| 6,219,291 B1 | * | 4/2001 | Sowards et al. | 365/207 |
| 6,333,517 B1 | * | 12/2001 | Tamaki | 257/48 |
| 6,643,162 B2 | * | 11/2003 | Takeuchi et al. | 365/145 |
| 6,841,396 B2 | | 1/2005 | Celii et al. | |
| 6,850,428 B2 | * | 2/2005 | Kang | 365/145 |
| 7,190,190 B1 | * | 3/2007 | Camarota et al. | 326/38 |
| 7,221,578 B2 | * | 5/2007 | Lee et al. | 365/145 |
| 7,245,518 B2 | * | 7/2007 | Watanabe | 365/145 |
| 2012/0062279 A1 | * | 3/2012 | Kuhn et al. | 327/65 |
| 2012/0099392 A1 | * | 4/2012 | Shim et al. | 365/226 |

OTHER PUBLICATIONS

Ramtron, "FM22L16, 4Mbit Asynchronous F-RAM Memory," Data Sheet, May 2010.

* cited by examiner

*Primary Examiner* — Viet Q Nguyen
(74) *Attorney, Agent, or Firm* — Alan A. R. Cooper; Wade J. Brady, III; Frederick J. Telecky, Jr.

(57) ABSTRACT

A circuit to protect data on an FRAM during a read operation includes an FRAM voltage regulator having an output to supply an FRAM operating voltage to the FRAM. A voltage monitor monitors a supply voltage for the FRAM to generate a voltage fault signal if the supply voltage falls below a predetermined value. And a circuit responsive to the voltage fault signal maintains the FRAM operating voltage above a voltage required to assure data integrity of the FRAM for a sufficient time required to perform an FRAM read operation.

16 Claims, 5 Drawing Sheets

FAST RESPONSE CIRCUITS AND METHODS FOR FRAM POWER LOSS PROTECTION

FIELD

The various method and circuit embodiments described herein relate in general to improvements in FRAM circuits and methods, and, more specifically, to circuits and methods for protecting FRAM data in the presence of a power loss.

BACKGROUND

Ferroelectric random access memories (FeRAMs or FRAMs) are random access memories that use a ferroelectric layer to provide a nonvolatile memory capability. An FRAM, therefore, can hold data even after it is powered off.

FRAMs have many advantages over, for example, DRAMs, EEPROMs, and the like. For instance, FRAMs have fast write times, typically less than about 50 ns. Write operations to an FRAM occur at low voltage, and require very little current to change the data. In addition, FRAMs can endure 100 trillion read/write cycles or more without failing. Because of these advantages, the popularity of FRAMS is increasing for many applications.

However, FRAMs have a destructive read operation: a data write-back must be performed as part of a read operation in order to preserve the data held in the FRAM. Thus, in a read operation, the FRAM operating voltage must be maintained, typically at a minimum of 1.35V for about 110 ns, for a good read and write-back cycle. If the operating voltage is not maintained at a sufficient level, the data in the FRAM may fail to be written back into the FRAM cells, and may be irretrievably corrupted.

Normally, FRAMs are powered by a linear voltage regulator fabricated as a part of the FRAM die, with a large external filter capacitor. If, however, the external capacitor becomes shorted, or if shorts occur in other sections of the power management circuitry that create an immediate power loss on the FRAM supply voltage in the middle of read/write operation, the FRAM contents may be corrupted because the data write-back may not have been performed or completed.

What is needed, therefore, is a cost effective circuit and method to protect an FRAM during a power interruption, particularly during a read operation.

SUMMARY

A circuit and method are disclosed to address a power loss during a read operation of an FRAM. The circuit includes a linear voltage regulator and having an associated small, on-chip filter capacitor, a voltage fault monitoring circuit and isolation logic circuitry that immediately isolates logic inputs from FRAM controller, in the event of a power loss during a power supply voltage fault, in order to assure that the FRAM data integrity is maintained, at least throughout an FRAM read operation.

The term "fault" is used herein broadly to refer to any voltage fault condition that may occur, including a direct short to ground of any node on which a voltage may appear, a reduction in voltage on any node on which a voltage may appear that is below a voltage value required to sustain a read operation of the FRAM 12, or a reduction in voltage below any other predetermined voltage value.

In a typical application, such as a product having a digital microcontroller (MCU) core and FRAM, a standalone FRAM voltage regulator, and separate voltage supplies for various circuit functions may be provided. For example, an FRAM voltage supply, a separate digital voltage supply for the MCU core, a third I/O interface voltage supply, and a fourth voltage supply may be provided. The FRAM voltage regulator supplies an operating voltage, $V_{FRAM}$, to the FRAM. The digital voltage supply supplies the operating voltage, Vdd, to the microcontroller core. The third voltage supply provides a voltage, V3P3D, for I/O interface circuits to supply digital control signals to the digital circuits on the die from external analog circuits. And the fourth voltage supply supplies voltage, V3P3A, to most of the analog circuits.

Two comparators powered by the FRAM voltage regulator respectively monitor the voltages Vdd of the digital voltage supply and V3P3D of the third voltage supply. If a "logic correct" fault occurs in either voltage Vdd or V3P3D, the comparators immediately detect the faults and isolate the FRAM input control signals coming from FRAM controller inside MCU. A brown-out fault may be, for example, a voltage drop in any of Vcc, V3P3A, V3P3D and Vdd, or a complete power loss in any one of them. If the FRAM is in middle of a read or write operation when a brown-out fault occurs, the voltage, $V_{FRAM}$, provided by the FRAM voltage regulator is controlled to be above 1.35V for at least 110 ns (or longer, for example up to 500 ns) for it to finish the read or write operation to preserve the integrity of the FRAM data.

Thus, a circuit is described to protect data on an FRAM during a read or write operation. The circuit includes an FRAM voltage regulator having an output to supply an FRAM operating voltage to the FRAM. A voltage monitor monitors external die supply voltage Vcc, the microcontroller core operating voltage, Vdd, and the supply voltage, V3P3D to the I/O interface, and gives a brown-out fault. Two high speed comparators monitor microcontroller core operating voltage, Vdd and I/O interface voltage, V3P3D, and generate a voltage fault signal if the supply voltages fall below a respective "logic correct" threshold level. And a circuit responsive to the voltage fault maintains the FRAM operating voltage above a voltage required to assure data integrity of the FRAM for a sufficient time to complete at least an FRAM read operation.

Also described is a semiconductor product that includes a functional circuit and an FRAM programmed with data for use in the operation of the functional circuit. A power supply voltage regulator provides a regulated power supply voltage to the product when a power supply voltage is applied to the product. A functional circuit voltage supply circuit receives the regulated power supply voltage and provides a regulated functional supply voltage to the functional circuit. An FRAM voltage supply circuit receives the regulated power supply voltage and supplies an FRAM supply voltage to the FRAM. And a voltage maintaining circuit is configured to maintain a supply voltage on the FRAM in the event of a fault in the regulated power supply voltage for a time at least as long as a time needed to complete an FRAM read operation.

Also described is a method for protecting data on an FRAM. The method includes storing an FRAM supply voltage during a normal FRAM operation, and, in the event of a fault in the FRAM supply voltage, clamping the stored FRAM supply voltage to a power input of the FRAM for a time sufficiently long to power the FRAM during a read operation.

BRIEF DESCRIPTION OF THE DRAWINGS

In the various figures of the drawing, like reference numbers are used to denote like or similar parts.

DETAILED DESCRIPTION

Overview

Figure 1:
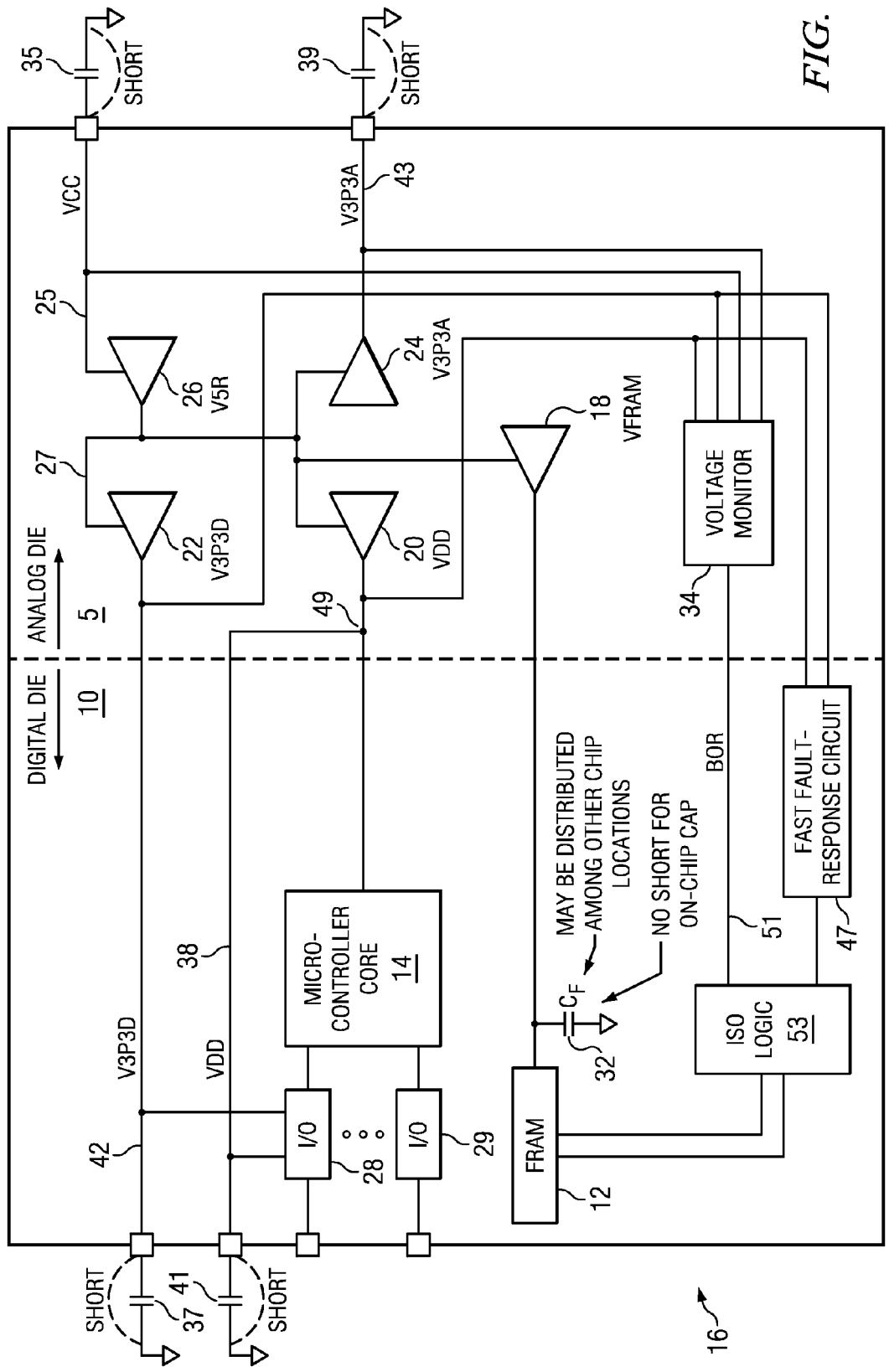
FIG. 1 is a block diagram of an FRAM protection circuit embodiment together with an illustrative environment in which the FRAM provides an on-chip memory capability to a microcontroller core.

FIG. 1, to which reference is now made, is a block diagram of an FRAM protection circuit in an illustrative environment in which an FRAM 12 provides an on-chip memory capability to a functional circuit, such as a microcontroller core 14, as shown. Although the embodiment illustrated in FIG. 1 is a two-chip, semiconductor product 16, having an analog die 5 and a digital data die 10, the semiconductor product 16 may be fabricated on a single die, if desired.

The analog die 5 provides separate linear voltage supplies for the various circuit functions integrated onto the digital die 10. In the particular embodiment illustrated, a standalone linear FRAM voltage regulator 18, a digital voltage regulator 20, an I/O interface voltage regulator 22, and an analog circuitry voltage regulator 24 are provided as voltage supplies to respective circuits described below in the semiconductor product 16. All of the voltage regulators 18, 20, 22, and 24 are powered by an external die supply voltage, Vcc. Each of the voltage supply input or output pins on the semiconductor product 16 has an external filter capacitor 35, 37, 39, and 41 connected to ground.

An input voltage pre-regulator 26 regulates the externally applied die input voltage, Vcc, on line 25, and is provided because the die supply voltage, Vcc, on line 25 may have a large voltage variation range. The input voltage pre-regulator 26 provides an input supply voltage V5R on line 27, but it serves a number of other purposes, as well. In addition to regulating the varying die supply voltage, Vcc, for example to 5 volts, it isolates die input voltage, Vcc, from the other internal circuitry in the event of a direct short or fault of the external die supply voltage, Vcc.

Thus, even a direct short of the external die input voltage, Vcc, does not cause a short to the supply voltage V5R on line 27 of the input voltage pre-regulator 26, since the line 27 is located at an internal node. This enables the regulated operating voltage, $V_{FRAM}$, to the FRAM 12 to be protected under other fault cases, as addressed below. In addition, the input voltage pre-regulator 26 creates a low voltage domain for the remaining voltage regulators 18, 20, 22, and 24, thereby avoiding the need for high voltage devices and saving die area. Also, it provides a good power supply rejection ratio with respect to the external die supply voltage, Vcc.

In operation, the linear FRAM voltage regulator 18 supplies the regulated operating voltage, $V_{FRAM}$, to the FRAM 12. The digital voltage regulator 20 supplies the operating voltage, Vdd, to the microcontroller core 14. The I/O interface voltage regulator 22 provides a supply voltage, V3P3D, to the I/O interface circuits 28 . . . 29, which supply digital data and control signals to the microcontroller core 14 and other digital circuits on the semiconductor product 16. And, the analog circuit voltage regulator 24 provides a supply voltage, V3P3A, to the most of analog circuits (not shown). The input voltage pre-regulator 26, the I/O interface voltage regulators 22, and the analog circuit voltage regulator 24 each have fault protection resistors (shown and described in FIG. 3 below) connected between their inputs and back-gates of passive PMOS devices, to provide respective conduction paths isolating the affected voltage regulators.

A voltage monitor circuit 34, in combination with the fast fault-response voltage monitoring circuit 47 of FIG. 6 below, monitors the external die supply voltage, Vcc, the microcontroller core operating voltage, Vdd, and the supply voltage, V3P3D, to the I/O interface. As an example, if the voltage monitor 34 detects a fault in the external die voltage, Vcc, or if the external die voltage, Vcc, is less than a pre-determined threshold voltage, such as 3.25V, a power brown-out (BOR) fault signal will be issued to the microcontroller core 14 to force the FRAM 12 to finish its last operation, and a delayed (~230 ns) version of the brown-out fault (BOR_DELAY) signal that is generated through an RC delay circuit is issued to reset the FRAM 12, as described in greater detail with reference to FIG. 7 below. (A 230 ns delay is sufficient for the FRAM 12 to finish its last operation before the FRAM 12 is reset by BOR_DELAY signal.)

If a fault occurs in either the microcontroller core operating voltage, Vdd, or the supply voltage, V3P3D, to the I/O interface, as a fact Vdd or V3P3D voltage is below a "logic correct" threshold level (less than their respective "brown-out" threshold level) that could cause logic error, the fast fault-response voltage monitoring circuit 47 immediately detects the fault and sends a voltage fault signal to the FRAM isolation logic circuitry 53 and isolates the FRAM 12 from incoming signals, as described in greater detail with reference to FIG. 6 below.

Thus, if the FRAM 12 is in middle of a read or write operation when a fault occurs, the FRAM 12 is isolated from additional FRAM control signals in case either the Vdd or V3P3D voltage is low enough to cause a logic error, and the regulated operating voltage, $V_{FRAM}$, to the FRAM 12 provided by the linear FRAM voltage regulator 18 is controlled to remain above 1.35V for at least 110 ns, or longer, if necessary, for the read or write operation to finish in order to preserve the integrity of the data held in the FRAM 12.

To assist in maintaining the FRAM regulated operating voltage, $V_{FRAM}$, in the event of a voltage fault, in the circuit embodiment of FIG. 1, an on-chip filter capacitor, CF, 32 is connected to ground from the output of the linear FRAM voltage regulator 18. Because of the limited size of the digital die 10 and limited available space on it, the on-chip filter capacitor 32 may be distributed in open die areas, such as in the gaps between bond pads (not shown). Therefore, the on-chip filter capacitor 32 can be created with combination or distribution of a number of small capacitors in or around the bond pad ring or other available areas.

Thus, in the event of a voltage fault, the linear FRAM voltage regulator 18 supplies the regulated operating voltage, $V_{FRAM}$, to the FRAM 12 of more than 1.35V for a time sufficient to complete an FRAM read operation, for example, of at least 110 ns, after a fault is detected. The fault may be under any fault case, including faults in any one of the external die supply voltage, Vcc, the analog circuits supply voltage, V3P3A, the I/O interface supply voltage, V3P3D, or the microcontroller core operating voltage, Vdd.

However, in some designs, because the on-chip filter capacitor 32 may be limited to a relatively small size, the charge stored in the on-chip filter capacitor 32 may be insufficient to sustain the regulated operating voltage, $V_{FRAM}$, to the FRAM 12 for a sufficiently long time to enable the read or write cycle to properly finish due to a voltage fault. Also, the load transient response of the linear FRAM voltage regulator 18 might be poor because of a small sized filter capacitor 32. Thus, a regulator arrangement may be also employed to address those two potential problems, as shown in FIG. 2, to which reference is now additionally made.

The Linear FRAM Voltage Regulator

Figure 2:
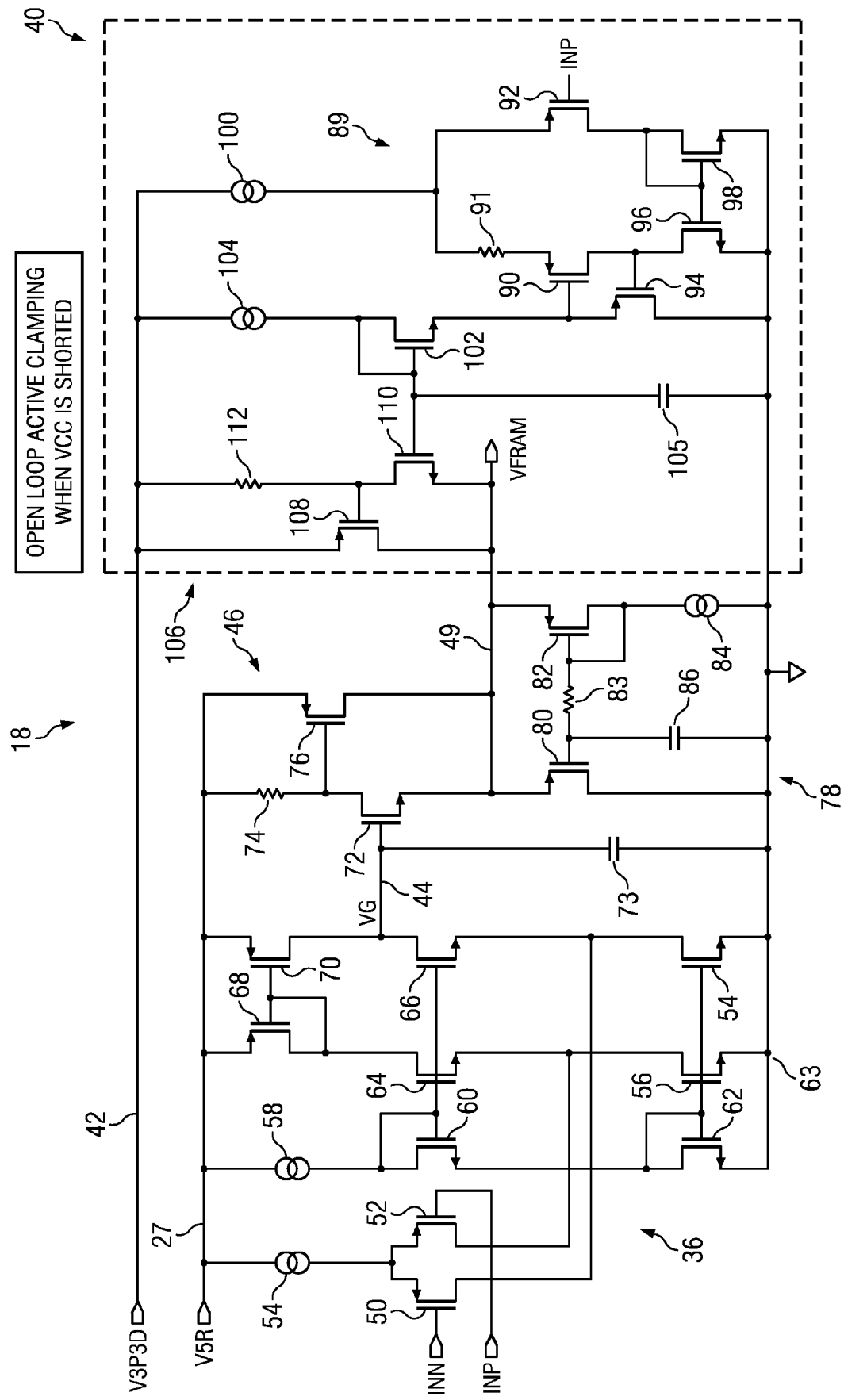
FIG. 2 is an electrical schematic diagram of an embodiment of the linear FRAM voltage regulator of FIG. 1 that supplies the regulated operating voltage, $V_{FRAM}$, to the FRAM.

FIG. 2 is an electrical schematic diagram of an embodiment of the linear FRAM voltage regulator 18. The linear FRAM voltage regulator 18 has two sections, a first section 36 that receive the input regulated supply voltage, V5R, on line 27 from the V5R voltage regulator 26, and a second section 40 that receives the I/O interface supply voltage, V3P3D, on line 42 at the output of the third I/O voltage supply 22.

The first section 36 provides a biasing voltage on the VG node 44, which controls a source-follower output circuit 46 to regulate the FRAM regulated output voltage, $V_{FRAM}$, on line 49. A reference voltage (INP) is applied to the gate of PMOS reference voltage device 52, which are driven by a current source 54 to add current respectively to NMOS transistors 50 and 52. The FRAM regulated operating voltage, $V_{FRAM}$, on line 49, and INN, on the gate of device 50, are tied together to perform a unit gain buffer, such that the FRAM regulated operating voltage, $V_{FRAM}$, is equal to the reference voltage (INP).

A biasing current path includes a current source 58 and two drain and gate connected NMOS devices 60 and 62 connected in series between the regulated input operating voltage, V5R, on line 27 and a reference potential, or ground 63. The biasing voltages developed between the gates and drains of the NMOS devices 60 and 62 are respectively applied to the gates of NMOS devices 64 and 66 and NMOS devices 56 and 54. Active load PMOS devices 68 and 70 establish a baseline current in transistors 64 and 56 and in transistors 66 and 54, respectively, to which the current from the PMOS reference voltage devices 50 and 52 is added.

The output voltage on node VG 44 is developed between the drains of PMOS device 70 and NMOS device 66 to control an NMOS device 72. A dominant pole on node VG 44 is compensated by a compensation capacitor 73. The NMOS device 72 is connected in series with a resistor 74 between the input regulated supply voltage, V5R, on line 27 and the FRAM regulated operating voltage, $V_{FRAM}$, on line 49. A PMOS device 76 is also connected between the input regulated supply voltage, V5R, on line 27 and the FRAM regulated operating voltage, $V_{FRAM}$, on line 49, with its gate connected between the drain of the NMOS device 72 and the resistor 74, to serve as a output device providing the FRAM regulated operating voltage, $V_{FRAM}$, on line 49, in a manner below described.

An open-loop sensing and clamping circuit 78 is provided to sense the FRAM regulated operating voltage, $V_{FRAM}$, on line 49, as described below. The open-loop sensing and clamping circuit 78 has a PMOS device 80 connected between the $V_{FRAM}$ line 49 and ground 63. Similarly, a PMOS device 82 is connected in series with a current source 84 between the $V_{FRAM}$ line 49 and ground 63, and the gate and drain of the PMOS device 82 are interconnected. The gates of the PMOS devices 80 and 82 are connected by a resistor 83, and a capacitor 86 is connected between the gate of the PMOS device 80 and ground 63.

The second section 40 provides a single-gain-stage operational amplifier 89, including PMOS devices 90, 92, and 94 and NMOS devices 96 and 98 that serve as active loads for the PMOS devices 90 and 92. A current source 100 is connected between the V3P3D line 42 to the source of the PMOS device 92 and to the source of PMOS device 90 through an offset resistor 91. The operational amplifier 89 buffers the reference potential INP on the gate of PMOS device 92 with some offset set by resistor 91 and current source 100, to the source of PMOS device 94, which is in series with a drain and gate connected NMOS device 102 and current source 104 between the V3P3D voltage input line 42 and ground 63. A capacitor 105 connects the gates of NMOS devices 102 and 110 to ground 63, to hold the voltage on the gate of NMOS device 102, as described below.

A clamp circuit 106 includes a PMOS device 108 connected between the V3P3D line 42 and the $V_{FRAM}$ output line 49, and an NMOS clamping device 110 and resistor 112 connected in series, also connected between the V3P3D line 42 and the FRAM regulated operating voltage, $V_{FRAM}$, on line 49. The gate of the PMOS device 108 is connected to the node between the drain of the NMOS clamping device 110 and the resistor 112.

In operation of the linear FRAM voltage regulator 18, the source-follower output associated with the PMOS device 76 follows the current through the sense resistor 74. Under a light load condition, the current through the resistor 74 does not generate enough IR drop between the gate and source of the PMOS device 76 to turn it on. However, under a heavy load condition, the PMOS device 76 turns on and supplies most of the load current. In addition, the PMOS device 82 senses the average output voltage and stores it in the capacitor 86.

For a fast load transient from low current to high current, the resistor 74 senses the current, instantaneously turns on the PMOS device 74, and controls the undershoot of the output voltage within a specified range. On the other hand, for a fast load transient from high to low current, a voltage overshoot occurs. When this happens, the resistor 83 and the capacitor 86 act as a low-pass filter, holding the gate voltage of the PMOS device 80, thereby clamping the voltage on the $V_{FRAM}$ line 49.

The linear FRAM voltage regulator 18 together with the additional circuitry of FIGS. 3-7 below, provides fault protection against all of the possible fault conditions, as next described. The Vcc fault protection provided by the linear input voltage pre-regulator 26, is discussed above. A fault of the Vdd regulator 20 (see FIG. 1) does not affect the remaining regulators, since it is implemented with an output current limitation. A fault of the external die supply voltage, Vcc, the analog circuits supply, V3P3A, or the I/O interface supply voltage, V3P3D, however, can potentially impact the output voltage of the input linear voltage pre-regulator 26.

A Fault of the External Die Supply Voltage, Vcc

Figure 3:
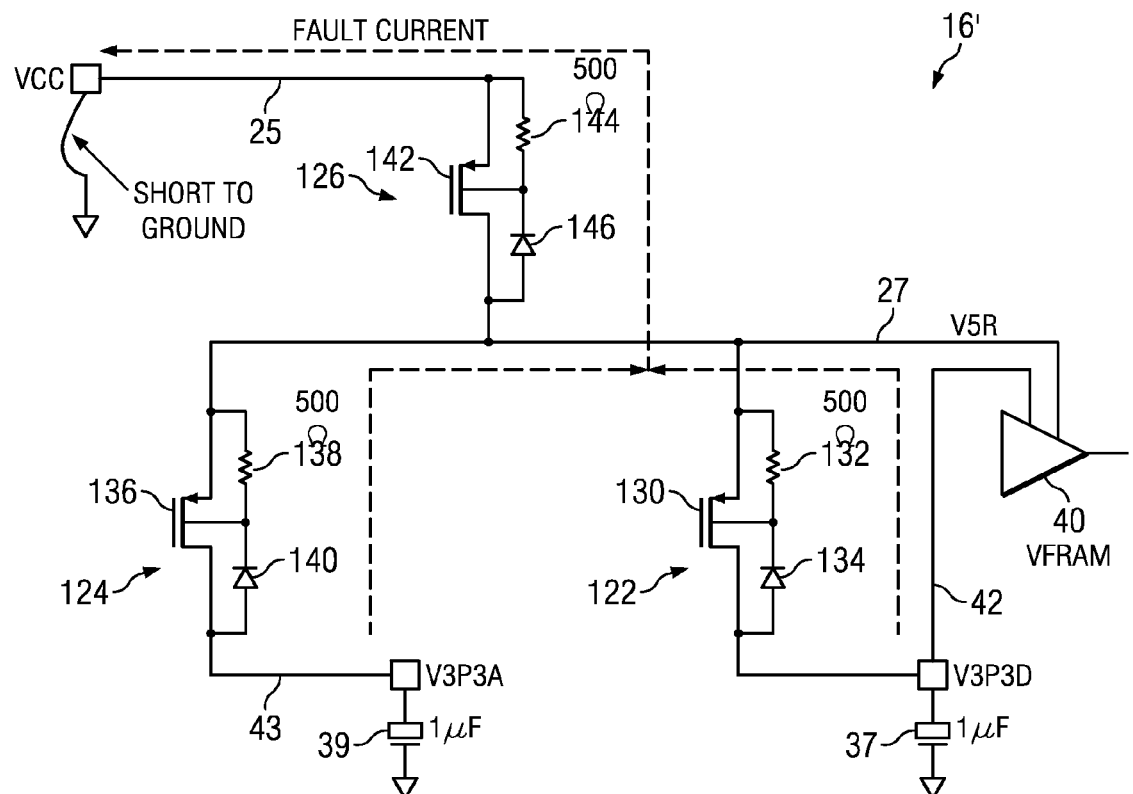
FIG. 3 is an electrical schematic diagram of a portion of the circuitry on the analog die of FIG. 1, showing an example of circuitry that protects against a fault of the external die supply voltage, Vcc.

With reference additionally now to FIG. 3, an electrical schematic is shown of a portion 16' of the circuits on the analog die 5 of FIG. 1, illustrating at least some of the circuits that are affected by a fault of the external die supply voltage, Vcc. As mentioned above, the input voltage pre-regulator 26, the analog circuit voltage regulators 22, and the I/O buffer voltage regulator each have fault protection capability to provide respective conduction paths isolating the affected voltage regulators 26, 22, and 24 in the event of a fault. The PMOS devices 142, 136, and 130 are the passive devices of the linear regulators V5R, V3P3A, and V3P3D, respectively, the remaining parts of the linear regulators not being shown in FIG. 3.

The I/O interface voltage regulator output stage shown in circuit 122, has a PMOS passive device 130 connected between the I/O interface supply voltage, V3P3D, on line 42 and the input regulated supply voltage, V5R, on line 27 from the input voltage pre-regulator 26. The diode 134 is the body diode of the PMOS passive device 130. A current limiting resistor 132 is connected between back-gate of the PMOS passive device 130 and the input regulated supply voltage, V5R.

In like fashion, the analog circuit voltage regulator output stage shown in circuit 124 has a PMOS passive device 136 connected between the analog circuit supply voltage, V3P3A, on line 43 and the input regulated supply voltage, V5R, on line 27 from the input voltage pre-regulator 26. The diode 140 is the body diode of the PMOS passive device 140. A current limiting resistor 138 is connected between back-gate of the PMOS passive device 140 and the input regulated supply voltage, V5R.

The input voltage pre-regulator output stage shown in circuit 126 has a PMOS passive device 142 connected between the input regulated supply voltage, V5R, on line 27 and the external die supply voltage, Vcc, on line 25. The diode 146 is the body diode of PMOS passive device 142. A current limiting resistor 144 is connected between back-gate of PMOS passive device 142 and the external die supply voltage, Vcc.

Thus, if a fault occurs in the external die supply voltage, Vcc, on line 25, the body diode 146 of PMOS passive device 142 is turned on and rapidly pulls the input regulated voltage supply, V5R, on line 27 to a voltage at least 2-diode drops below the supply voltage, V3P3D, on line 42. The source-to-back-gate resistors 132, 138, and 144, which, in the embodiment shown are, for example, about 500 ohms, limit any large fault currents. The external filter capacitors 39 and 41 on the V3P3A line 43 and V3P3D line 42 work through body diodes 134 and 140 of passive device 130 and 136 respectively, to maintain the input regulated supply voltage, V5R, on line 27. The voltage on the external filter capacitors 39 and 41 falls at a lower rate than the voltage on the input regulated supply voltage, V5R, on line 27. Because the voltage on the input regulated supply voltage, V5R, on line 27 drops too low to enable the FRAM voltage regulator 18 to work normally, the I/O interface supply voltage, V3P3D, supplied by the I/O interface voltage regulator 22 is made to be the FRAM voltage supply, finished by the open-loop sensing and clamping circuit 40, shown in FIG. 2.

Again referring to FIG. 2, the INP input on the gate of PMOS device 92 is a reference voltage that is buffered through the single-gain-stage operational amplifier 89. The offset resistor 91 provides a voltage offset on the source the PMOS device 90. The gate of PMOS device 90 ends up with a buffered voltage less than the voltage of INP. The induced offset avoids triggering the clamping circuit in normal operation. The buffered voltage of INP is then level shifted up by drain and gate connected NMOS device 102 to set the gate voltage of NMOS clamping device 110. The capacitor 105 holds the gate voltage of the NMOS clamping device 110. When a fault occurs in the Vcc voltage, the regulated operating voltage, $V_{FRAM}$, to the FRAM 12 begins to go low to trigger the NMOS clamping device 110. Thus, the NMOS clamping device 110 along with the PMOS device 108 maintain the FRAM regulated operating voltage, $V_{FRAM}$, for a time sufficient to complete a write operation to the FRAM 12, for example, at 1.35V for at least about 500 ns.

A Fault of the I/O Interface Supply Voltage, V3P3D

Figure 4:
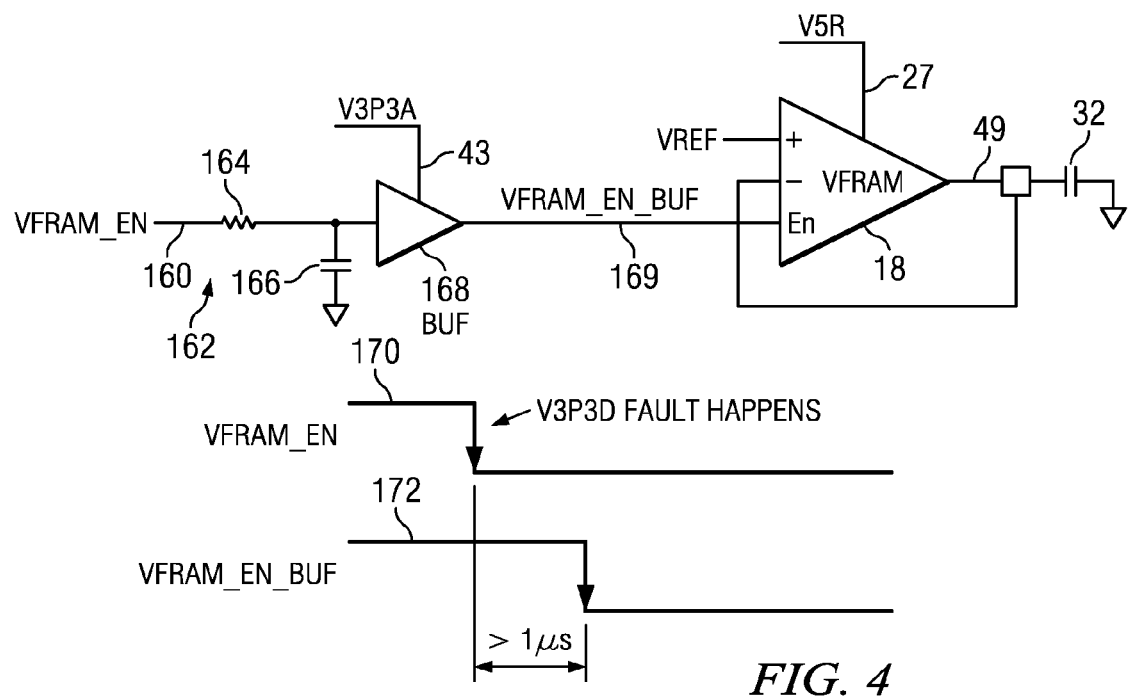
FIG. 4 is an electrical schematic diagram of a circuit embodiment to protect the FRAM in the event of a fault of the supply voltage, V3P3D.

In the event of a fault of the I/O interface supply voltage, V3P3D, the input regulated supply voltage, V5R, on line 27 is unaffected, because all its supporting circuits, such as reference voltages and currents, are powered by the analog circuit supply voltage, V3P3A. However, as shown in FIG. 4, to which reference is now additionally made, because all of the digital control signals are powered by the I/O interface supply voltage, V3P3D, the FRAM enable signal VFRAM_EN on line 160 to the FRAM voltage regulator 18 will go low.

Therefore, an RC filter 162 is provided, including a resistor 164, capacitor 166, and buffer 168. The time constant of the RC filter 162 is selected to hold the output from the buffer 168, VFRAM_EN_BUF, on line 169 high long enough to complete a write operation to the FRAM 12, for example 1 µs, as shown by waveform 170 and 172. This will keep the FRAM voltage regulator 18 enabled for at least 1 µs after a fault of the I/O interface supply voltage, V3P3D, occurs.

A Fault of the I/O Buffer Supply Voltage, V3P3A

In the event of a fault of the analog circuit supply voltage, V3P3A, all the reference voltages and currents are gone because the analog circuit supply voltage, V3P3A, is their power supply. Since the buffer 168 in FIG. 4 is powered by the analog circuit supply voltage, V3P3A, the signal VFRAM_EN_BUF on line 169 also goes low and disables the FRAM voltage regulator 18.

Figure 5:
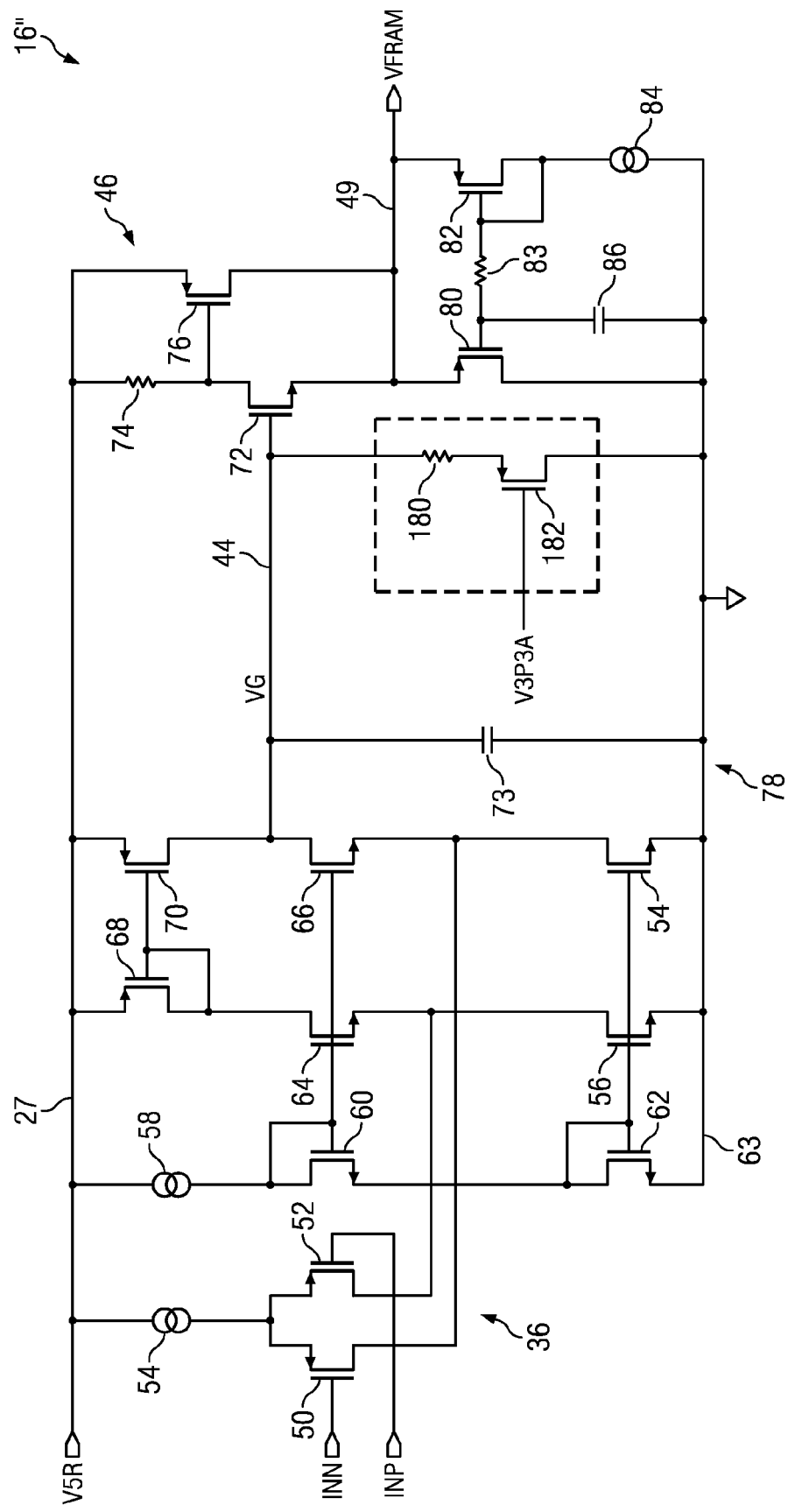
FIG. 5 is an electrical schematic diagram of a portion of the circuit of FIG. 2, illustrating the operation of the circuit in the event of a fault of the supply voltage, V3P3A.

Referring additionally now to FIG. 5, an electrical schematic diagram is shown illustrating a portion 16" of the circuit of FIG. 2, illustrating the provisions added to the circuit of FIG. 2 to protect against a fault of the analog circuit supply voltage, V3P3A. In the event of a fault of the analog circuit supply voltage, V3P3A, the PMOS devices 68 and 70 as well as the NMOS devices 54, 56, and 62 are turned off, because VFRAM_EN_BUF is low to set FRAM regulator to disable mode. (The disable circuitry is not shown in FIG. 5). The VG node 44 floats and holds its voltage by the charge stored in the compensation capacitor 73, which has a relatively large value. The input regulated supply voltage, V5R, on line 27 is still active and circuit 46 now works as open loop source-follower output and continues to provide the regulated operating voltage, $V_{FRAM}$, to the FRAM 12.

The leakage current of the PMOS device 70 could potentially raise the voltage on the VG node 44, and consequently raise the FRAM regulated operating voltage, $V_{FRAM}$. If the FRAM regulated operating voltage, $V_{FRAM}$, goes too high, the FRAM 12 could be damaged. Therefore, to avoid this potential problem, a current steering path, comprising a resistor 180 in series with a PMOS device 182 between the gate of the NMOS device 72 and ground may be provided, as shown. The resistor 180 has a large value, for example, one megaohm.

In normal operation, the analog circuit supply voltage, V3P3A, is high enough to turn off the PMOS device 182, and no current is steered from VG node 44. However, when a fault in analog circuit supply voltage, V3P3A, occurs, the PMOS device 182 turns on and slowly discharges the VG node 44 with a very small amount of current. The discharge rate on the VG node 44 is sufficiently slow that the regulated operating voltage, $V_{FRAM}$, is maintained above 1.35V for at least 500 ns.

Figure 6:
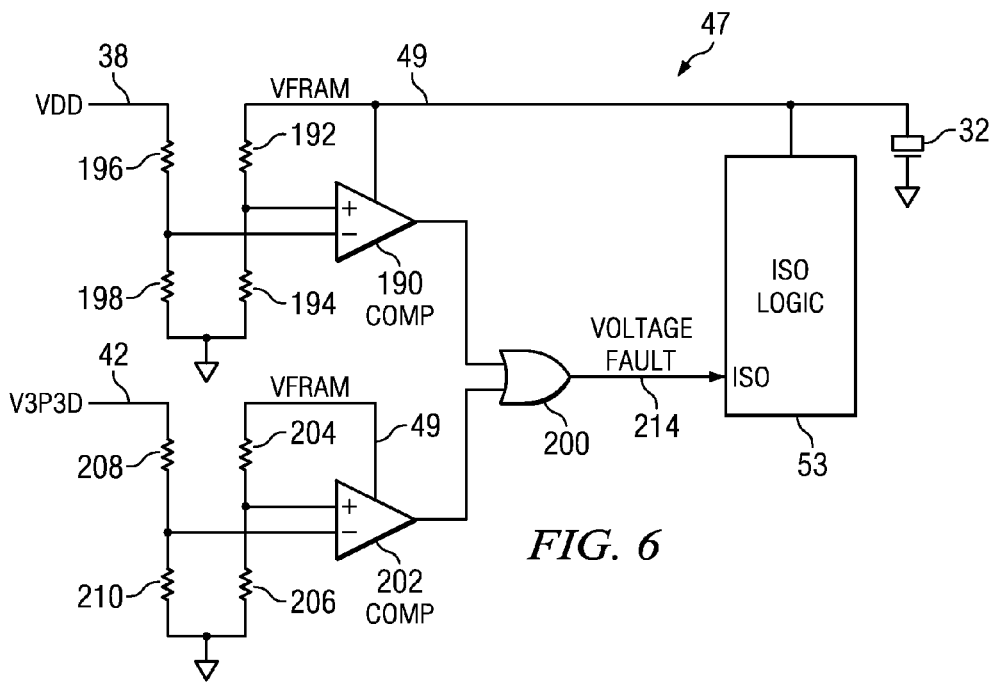
FIG. 6 is a block schematic diagram of fast fault-response circuit to detect a fault in the microcontroller operating voltage, Vdd, or the I/O interface supply voltage, V3P3D.

A Fault in the Microcontroller Operating Voltage, Vdd, or the I/O Interface Supply Voltage, V3P3D FIG. 6, to which reference is now additionally made, is a block schematic diagram of fast fault-response circuit 47 to detect a fault in the microcontroller operating voltage, Vdd, or the I/O interface supply voltage, V3P3D. The fast fault-response circuit 47 responds to a failure of those two voltages, and isolates the FRAM 12 from the failure to enable the completion of an FRAM operation.

The fast-fault response voltage monitoring circuit 47 of FIG. 6 includes a first high-speed comparator 190 that compares the microcontroller core operating voltage, Vdd, on line 38 to the FRAM regulated operating voltage, $V_{FRAM}$, on line 49. The microcontroller core operating voltage, Vdd, is connected to a first resistor voltage divider, including resistors 196 and 198, with their connection node being connected to the non-inverting input of the high-speed comparator 190. The microcontroller core operating voltage, Vdd, is connected to a second resistor voltage divider, including resistors 192 and 194, with their connection node being connected to the inverting input of the high-speed comparator 190. The output of the first high-speed comparator 190 is connected to one input of an OR-gate 200.

Additionally, the fast-fault response voltage monitoring circuit 47 of FIG. 6 includes a second high-speed comparator 202 that compares the I/O interface supply voltage, V3P3D, on line 42 to the FRAM regulated operating voltage, $V_{FRAM}$, on line 49. The FRAM regulated operating voltage, $V_{FRAM}$, is connected to a third resistor voltage divider, including resistors 204 and 206, with their connection node being connected to the non-inverting input of the second high-speed comparator 202. The I/O interface supply voltage, V3P3D, is connected to a fourth resistor voltage divider, including resistors 208 and 210, with their connection node being connected to the inverting input of the high-speed comparator 202. The output of the high-speed comparator 202 is connected to a second input of the OR-gate 200. The output of the OR-gate 200 is connected to the ISO input of an FRAM isolation logic circuitry 53.

Thus, in operation, if a fault occurs in the external die supply voltage, Vcc, or the output voltage of the linear digital voltage regulator 20 or the linear I/O interface voltage regulator 22 falls below pre-determined "brown-out" threshold value for any reasons, the BOR signal on line 51 will be asserted and the FRAM 12 will be notified to finish its remaining operation. At the same time, if the voltage of Vdd or V3P3D is below their respective "logic correct" threshold, which is normally much less than their respective "brown-out" threshold, digital circuits which are powered by Vdd or V3P3D, may start to have logic errors. As a result, FRAM controller may send control signals with logic errors to the FRAM 12, and consequently may cause FRAM data corruption. Thus, the fast fault-response circuit 47 is provided to isolate the control signals to the FRAM before the logic error occurs to the FRAM control signals. In circuit 47, the first and second high-speed comparators 190 and 202 monitor the microcontroller core operating voltage, Vdd, and the I/O interface supply voltage, V3P3D, and, in the event of a fault, immediately send a voltage fault signal to the isolation logic circuitry 53, consequently controlling the FRAM 12.

The FRAM Isolation Circuitry

Figure 7:
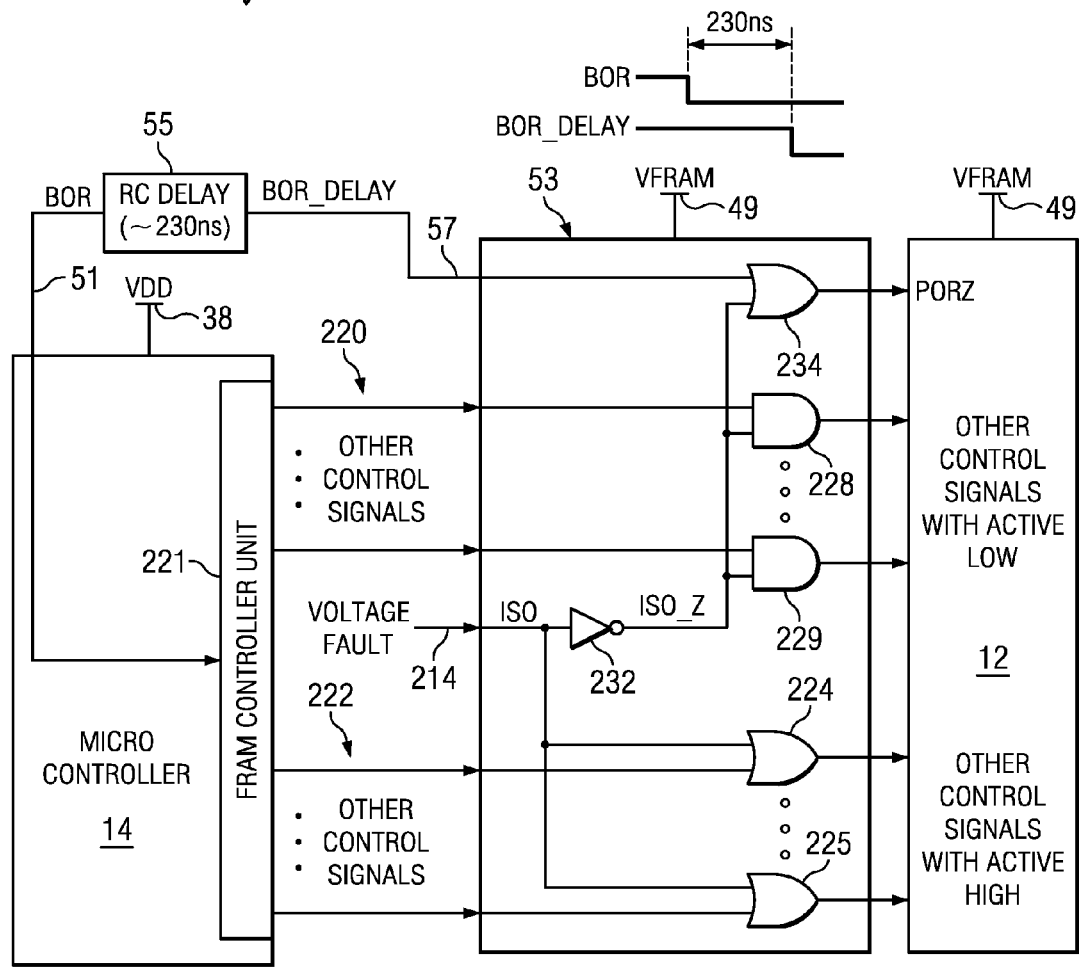
FIG. 7 is a block schematic diagram showing the circuitry of the FRAM isolation logic circuitry interposed between the microcontroller core and FRAM to isolate the FRAM from control signals in the event of a voltage fault of Vdd or V3P3D.

In the event that microcontroller core operating voltage, Vdd, or the I/O interface supply voltage, V3P3D is below their respective "logic correct" threshold level, all control signals to the FRAM are held, and the FRAM is immediately isolated to prevent any data corruption from occurring. Details of the FRAM isolation logic circuitry 53 are shown in FIG. 7, to which reference is now additionally made. The FRAM isolation logic circuitry 53 receives control signals 220 and 222 from the FRAM controller unit 221 inside the microcontroller core 14, the control signals 220 representing control signals having an active low control state and the control signals 222 representing control signals having an active high control state.

The control signals having active high control states are connected to one input of respective OR gates 224 . . . 225, and the voltage fault signal on line 214 from the output of OR gate 200 (FIG. 6) is connected to another input of each of the OR gates 224 . . . 225. Similarly, the control signals having active low control states are connected to one input of respective AND gates 228 . . . 229, and the voltage fault signal on line 214 from the output of OR gate 200 (FIG. 6) is inverted by an inverter 232 and connected to another input of each of the AND gates 228 . . . 229. The outputs from the OR gates 224 . . . 225 and AND gates 228 . . . 229 are connected to respective control line inputs of the FRAM 12.

The BOR signal on line 51 is connected to the FRAM controller unit 221 and to an RC delay circuit 55, which provides a delay of about 230 ns, to produce a BOR_DELAY signal on line 57. The BOR_DELAY signal on line 57 is connected to one input of an OR gate 234, and the voltage fault signal on line 214 from the output of OR gate 200 (FIG. 6), is connected to the other input of the OR gate 234. The output of the OR gate 234 is connected to the inverted power-on-reset (PORZ) input of the FRAM 12.

In operation, if a fault occurs in the external die supply voltage, Vcc, or the output voltage of the linear digital voltage regulator 20, or if the linear I/O interface voltage regulator 22 falls below "brown-out" threshold value for any reasons, the BOR signal on line 51 will be asserted and applied to the FRAM controller unit 221. The FRAM 12 will be notified by the FRAM controller unit 221 to finish its remaining operation. At the same time, if the voltage of either Vdd or V3P3D is below their respective "logic correct" threshold levels, the voltage fault signal on line 214 goes high, and is inverted by the inverter 232. The inverted voltage fault signal (now low) is applied to the OR gate 234 and AND gates 228 . . . 229. The voltage fault signal, combined with the BOR_DELAY signal on line 57, generates the PORZ signal for the FRAM 12. The FRAM 12 control signals having active low control states 220 and the control signals having active high control states 222 could have logic errors if a power fault of the microcontroller core operating voltage, Vdd, occurs. However, by virtue of the operation of the respective AND gates 228 . . . 229 and OR gates 224 . . . 225, all the control signals passing the FRAM isolation circuitry 53 remain in a determined logic level with respect to $V_{FRAM}$ power domain after a fault occurs.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. A circuit to protect data on an FRAM during a read operation in the event of a supply voltage fault, comprising:
   an FRAM voltage regulator to receive said supply voltage and having an output to supply an FRAM operating voltage to said FRAM; and
   a circuit responsive to a fault in said supply voltage to maintain an operating voltage on said FRAM, said operating voltage on said FRAM being above a voltage required to assure data integrity of said FRAM for a time sufficient to at least complete an FRAM read operation, a voltage monitor to monitor said supply voltages to generate a fault signal if any of said supply voltages falls below a predetermined value, wherein said voltage fault signal can be generated in response to a short of a voltage selected from each of a group including:
an external die supply voltage,
a microcontroller core operating voltage,
an I/O buffer supply voltage, and
an I/O interface supply voltage.

2. The circuit of claim 1 wherein said circuit to maintain said operating voltage on said FRAM comprises:
at least one capacitor to hold an FRAM operating voltage for said sufficient time; and a clamp to hold said capacitor voltage on said FRAM in the event of a fault of said supply voltage.

3. The circuit of claim 1 further comprising an isolation circuit responsive to said fault signal to isolate said FRAM from changes in control signals.

4. A semiconductor product, comprising:
a functional circuit;
an FRAM operatively connected to said functional circuit to store data for use in the operation of said functional circuit;
a power supply voltage regulator to provide a regulated power supply voltage from an input power supply voltage;
a functional circuit voltage supply circuit connected to receive said regulated power supply voltage and to provide a regulated functional supply voltage to said functional circuit;
an FRAM voltage supply circuit connected to receive said regulated power supply voltage and to supply an FRAM supply voltage to said FRAM; and
a voltage maintaining circuit configured to maintain a supply voltage on said FRAM of magnitude sufficient to complete an FRAM read operation for a time at least as long as a time needed to complete said FRAM read operation in the event of a fault of either
said regulated functional supply voltage or
said FRAM supply voltage,
wherein said fault is a short of any voltage selected from each of a group including:
said input power supply voltage,
said regulated functional supply voltage, and
said FRAM supply voltage.

5. The product of claim 4 wherein said power supply voltage regulator is a pre-regulator circuit and said functional circuit voltage supply circuit and said FRAM voltage supply circuit are voltage regulator circuits.

6. The product of claim 4 wherein said fault is a drop in said FRAM supply voltage to a level below which a read operation of said FRAM cannot be reliably performed.

7. The product of claim 4 wherein said functional circuit comprises a microcontroller core.

8. The product of claim 4 wherein said voltage maintaining circuit comprises:
a capacitor connected to a voltage supply input of said FRAM and to be charged by said FRAM supply voltage, said capacitor being sufficiently large to hold an adequate voltage for a time sufficient to power said FRAM during said read operation in the absence of a voltage from said FRAM supply voltage.

9. The product of claim 8 wherein said capacitor is a distributed capacitor.

10. The product of claim 4 further comprising an I/O interface voltage supply circuit and an I/O buffer voltage supply circuit.

11. The product of claim 10 wherein said fault is caused by a short of either said I/O interface supply circuit or said I/O buffer voltage supply circuit.

12. The product of claim 4 further comprising a voltage monitor to monitor said regulated power supply voltage to produce a brown-out signal in the event of a drop in said input power supply voltage below a first voltage level, and a fast fault-response circuit to produce a fault signal if any supply voltage drops below a second voltage level.

13. The product of claim 12 further comprising an isolation circuit to isolate said FRAM from FRAM control signals in response to either said brown-out or said fault signals.

14. A method for protecting data on an FRAM, comprising:
providing an FRAM voltage regulator for supplying a FRAM supply voltage,
storing the FRAM supply voltage during a normal FRAM operation; and,
in the event of a fault in said FRAM supply voltage, clamping said stored FRAM supply voltage to a power input of said FRAM for a time sufficiently long to power said FRAM during a read operation, and wherein said clamping is performed in said FRAM voltage regulator in response to a voltage fault signal;
wherein said voltage fault signal is generated in response to a short of any voltage selected from each of a group including;
an external die supply voltage,
a microcontroller core operating voltage,
an I/O buffer supply voltage, and
an I/O interface supply voltage.

15. The method of claim 14 wherein said storing an FRAM supply voltage during a normal FRAM operation comprises storing said FRAM supply voltage in a capacitor having a plurality of capacitors distributed on a semiconductor die containing said FRAM.

16. The method of claim 14 further comprising isolating said FRAM voltage regulator from other voltage regulators that supply voltages to said semiconductor die containing said FRAM.

* * * * *